US012396118B2

(12) United States Patent
Ito et al.

(10) Patent No.: US 12,396,118 B2
(45) Date of Patent: Aug. 19, 2025

(54) ELECTRONIC APPARATUS

(71) Applicant: Sony Interactive Entertainment Inc., Tokyo (JP)

(72) Inventors: Katsushi Ito, Chiba (JP); Kazutaka Eto, Tokyo (JP); Kazuya Odagiri, Kanagawa (JP); Sho Kobayashi, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 152 days.

(21) Appl. No.: 18/554,224

(22) PCT Filed: Apr. 18, 2022

(86) PCT No.: PCT/JP2022/018066
§ 371 (c)(1),
(2) Date: Oct. 6, 2023

(87) PCT Pub. No.: WO2022/224937
PCT Pub. Date: Oct. 27, 2022

(65) Prior Publication Data
US 2024/0188245 A1 Jun. 6, 2024

(30) Foreign Application Priority Data

Apr. 19, 2021 (JP) ................. 2021-070604

(51) Int. Cl.
*H05K 7/12* (2006.01)
*H01Q 1/22* (2006.01)
(Continued)

(52) U.S. Cl.
CPC ............ *H05K 7/12* (2013.01); *H01Q 1/2291* (2013.01); *H05K 1/0215* (2013.01); *H05K 9/0098* (2013.01); *H05K 2201/10098* (2013.01)

(58) Field of Classification Search
CPC ...... H05K 7/12; H05K 1/0215; H05K 9/0098; H05K 2201/10098; H01Q 1/2291
See application file for complete search history.

(56) References Cited

U.S. PATENT DOCUMENTS 9,941,574 B2   4/2018  Hotta
10,321,616 B2  6/2019  Sasaki
(Continued)

FOREIGN PATENT DOCUMENTS

JP    2012174942 A  *  9/2012
JP    2013222776 A     10/2013
(Continued)

OTHER PUBLICATIONS

International Search Report for corresponding PCT Application No. PCT/JP2022/018066, 4 pages, dated Jul. 19, 2023.
(Continued)

*Primary Examiner* — Henry Luong
(74) *Attorney, Agent, or Firm* — Kilpatrick Townsend & Stockton LLP

(57) ABSTRACT

Provided is an electronic apparatus in which a state where a cable is in contact with a ground part can be stably maintained for a long period of time. An electronic apparatus includes a shield that is in contact with a ground pattern on a circuit board and that functions as a ground part. The cable extends from a front antenna, is connected to the circuit board, and passes between the shield and a first cushioning member. An inner surface of the housing presses the first cushioning member against the shield.

8 Claims, 6 Drawing Sheets

(51) Int. Cl.
H05K 1/02 (2006.01)
H05K 9/00 (2006.01)

(56) References Cited

U.S. PATENT DOCUMENTS

| | | |
|---|---|---|
| 2015/0155613 A1 | 6/2015 | Hotta |
| 2018/0042148 A1 | 2/2018 | Sasaki |
| 2020/0245513 A1 | 7/2020 | Neukam |

FOREIGN PATENT DOCUMENTS

| | | |
|---|---|---|
| JP | 2018022752 A | 2/2018 |
| JP | 6820492 B1 | 10/2021 |
| WO | 2014136243 A1 | 9/2014 |

OTHER PUBLICATIONS

Decision to Grant a Patent for corresponding JP Application No. 2023515465, 4 pages, dated May 30, 2024.

* cited by examiner

ELECTRONIC APPARATUS

TECHNICAL FIELD

The present invention relates to an electronic apparatus.

BACKGROUND ART

Some wireless communication function-equipped electronic apparatuses as exemplified by game machines and personal computers have an antenna and a circuit board connected via a cable. Japanese Patent Laid-Open No. 2018-22752 and Japanese Patent Laid-Open No. 2013-222776 each disclose an electronic apparatus including a shield that covers a circuit board and that blocks electromagnetic waves emitted from an integrated circuit. The shield is in contact with a ground pattern which is formed on the circuit board. A cable is attached to the shield, and is laid along the shield. Accordingly, noise which is generated in a signal propagating through the cable can be reduced.

Summary Technical Problem

An adhesive tape is used to attach a cable to a surface of a shield, in some cases. However, in this method, the adhesion of the adhesive tape is deteriorated due to heat of an integrated circuit or the irregularity of the shield, for example, so that the cable may come off the shield.

Solution to Problem

The present disclosure proposes an electronic apparatus including a circuit board, a ground part that is formed on the circuit board or is mounted on the circuit board, a first antenna, at least one cushioning member, a cable that extends from the first antenna, is connected to the circuit board, and passes between the ground part and the at least one cushioning member, and a member that presses the cushioning member against the ground part. According to this electronic apparatus, the state where the cable is in contact with the ground part can be stably maintained for a long period of time.

DESCRIPTION OF EMBODIMENT

Figure 1:
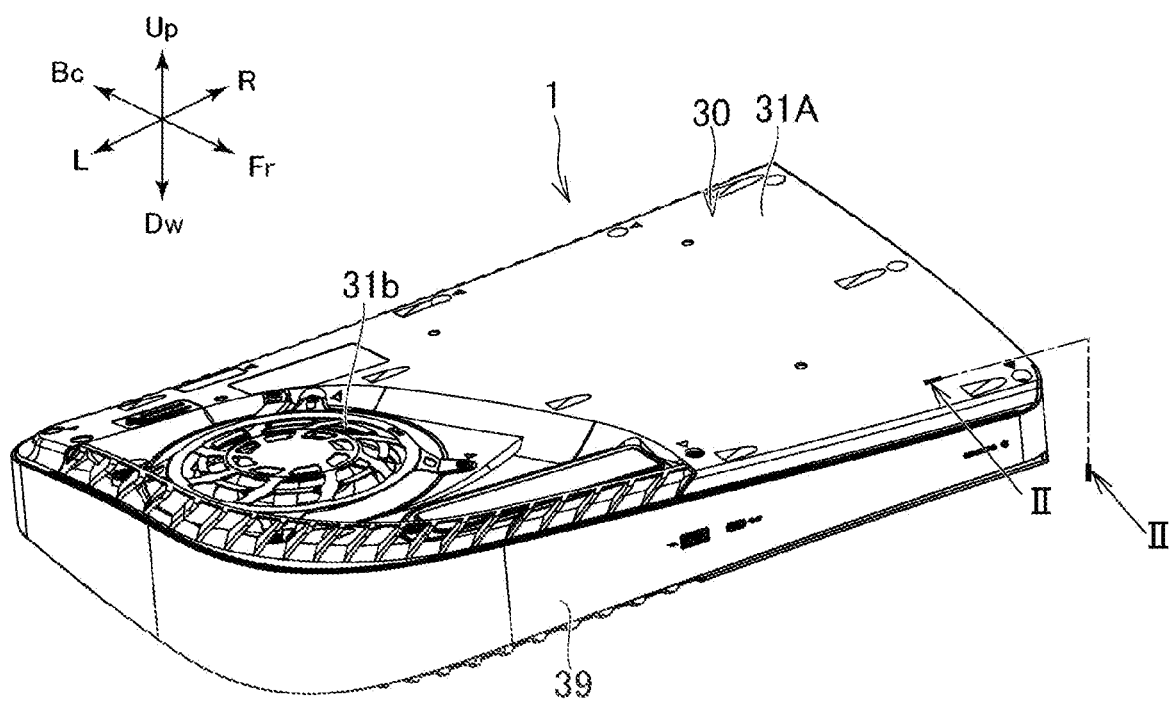
FIG. 1 is a perspective view of an electronic apparatus that the present disclosure proposes.

Hereinafter, an explanation will be given of an electronic apparatus that the present disclosure proposes. The following explanation is made with respect to an electronic apparatus 1 illustrated in FIG. 1, etc., as an example of the electronic apparatus. In the following explanation, the directions indicated by Fr and Bc in FIG. 1 are referred to as a front direction and a back direction, respectively. The directions indicated by Up and Dw in FIG. 1 are referred to as an upward direction and a downward direction, respectively. The directions indicated by R and L in FIG. 1 are referred to as right direction and left direction, respectively. These directions are used to indicate the relative positions of components, parts, and members included in the electronic apparatus, and are not intended to specify the posture of the electronic apparatus.

The electronic apparatus 1 is an entertainment apparatus that functions as a game apparatus or an audio visual apparatus, for example. The electronic apparatus 1 outputs video data which is generated by execution of a game program, video/sound data obtained over a network, or video/sound data obtained from a recording medium such as an optical disk, to a display apparatus such as a television. The electronic apparatus may be a personal computer, for example.

Figure 2:
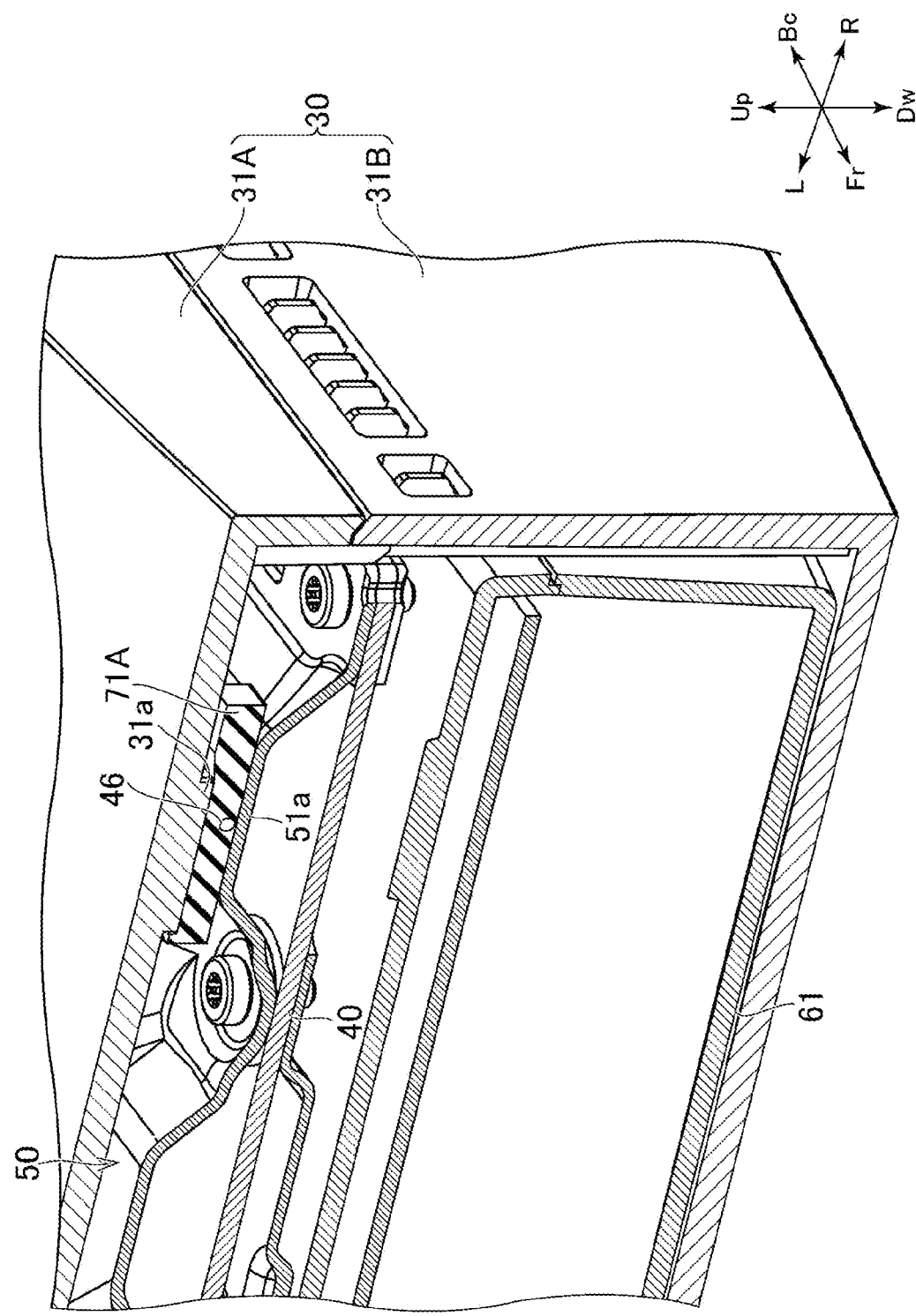
FIG. 2 is a cross sectional view taken along line II-II in FIG. 1.

As illustrated in FIG. 1, the electronic apparatus 1 includes a housing 30 that houses a circuit board 40 (see FIG. 2). The housing 30 includes an upper housing member 31A (see FIG. 2) and a lower housing member 31B (see FIG. 2), for example. The upper housing member 31A and the lower housing member 31B are fitted to each other in the up-down direction. The electronic apparatus 1 may include a front panel 39. The front panel 39 may be mounted on the front side and the left side of the housing 30.

Figure 4:
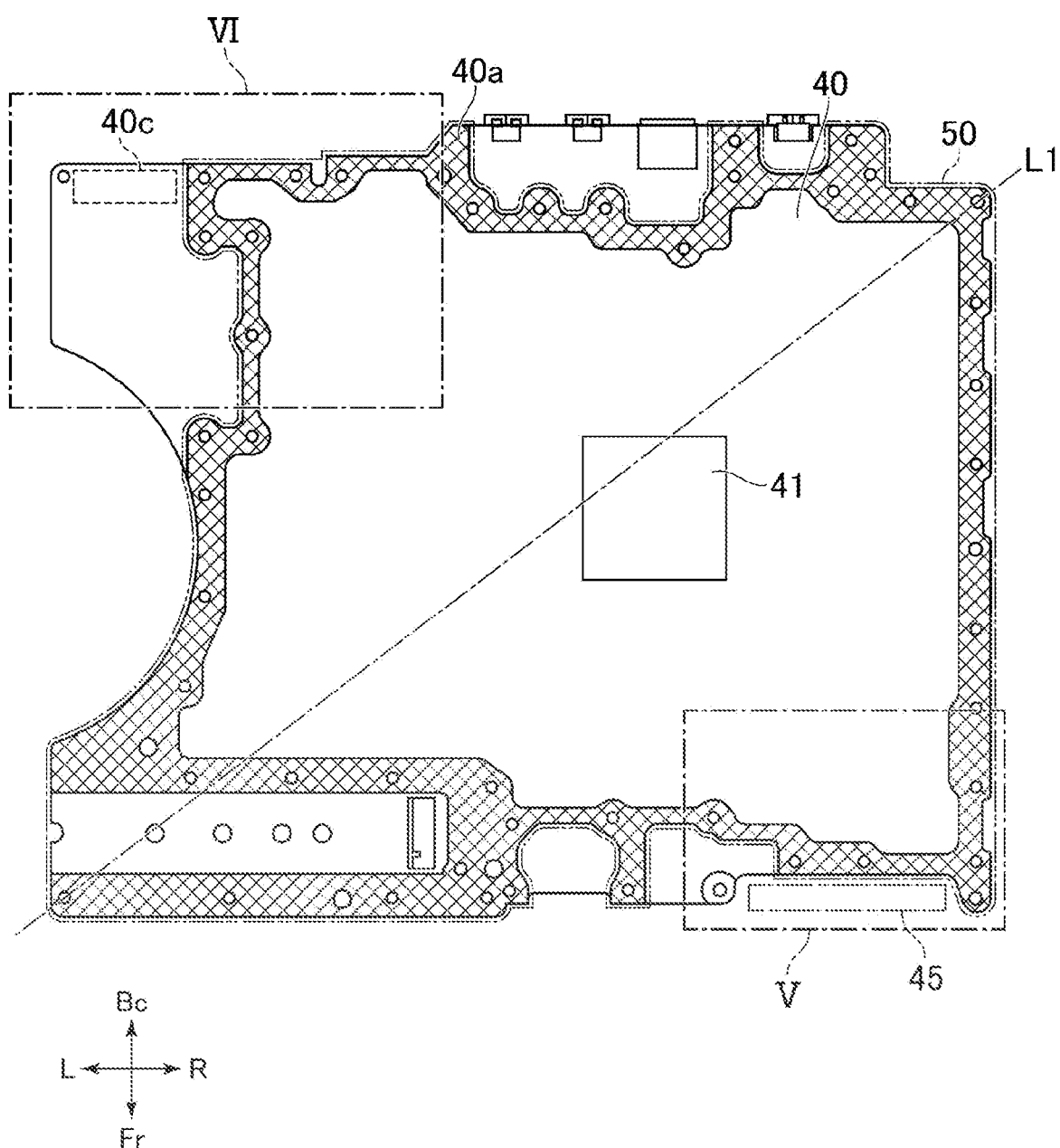
FIG. 4 is a plan view of the circuit board.

A cooling fan for cooling an electronic component 41 (e.g., an integrated circuit such as a central processing unit (CPU) or a graphics processor unit (GPU) (see FIG. 4)) mounted on the circuit board 40 may be housed in the housing 30. Further, an air vent 31b for taking air into the housing 30 or discharging air from the housing 30 when the cooling fan is being driven may be formed in the housing 30.

The electronic apparatus 1 includes a shield 50 (see FIG. 3) that covers an electronic component 41 mounted on the circuit board 40 and blocks electromagnetic waves emitted from the electronic component 41 and electromagnetic waves coming from the outside. The shield 50 is made of a conductor (metal such as iron, aluminum, or stainless steel). A ground pattern 40a (see FIG. 4) is formed on the upper surface of the circuit board 40 (a shaded area in FIG. 4 indicates the ground pattern 40a). The ground pattern 40a is formed along the outer peripheral edge of the circuit board 40, for example. An outer peripheral portion 50a of the shield 50 is in contact with the ground pattern 40a, and functions as a ground part. The electronic apparatus 1 may include a heat sink 59 for cooling an electronic component mounted on the circuit board 40.

Figure 3:
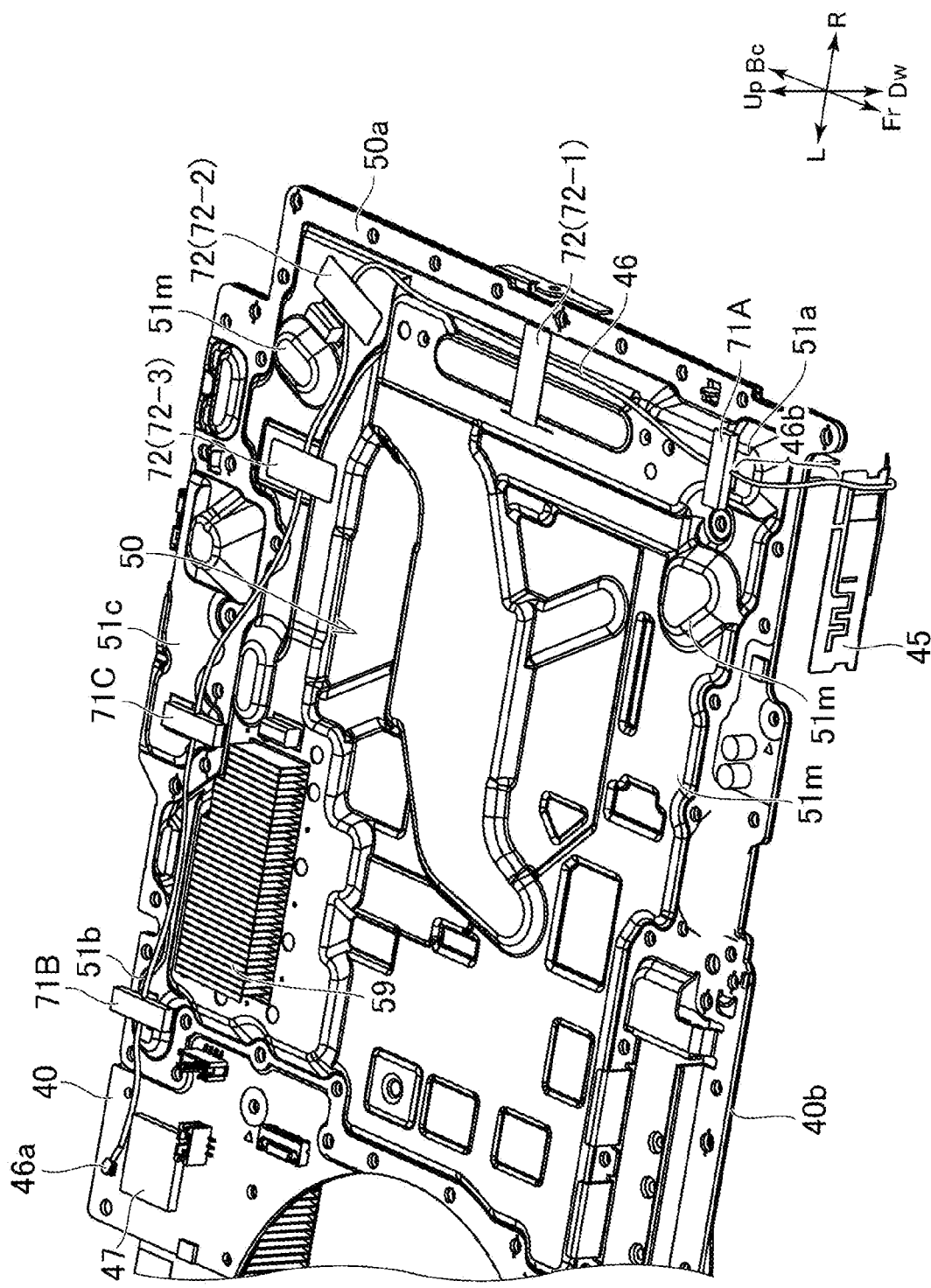
FIG. 3 is a perspective view of a circuit board and a shield which are housed in a housing of the electronic apparatus.

As illustrated in FIG. 3, the electronic apparatus 1 includes a front antenna 45 that is disposed inside the housing 30. The front antenna 45 is an antenna provided for performing wireless communication conforming to the Wireless Fidelity (Wi-Fi) or Bluetooth (registered trademark) standard. The front antenna 45 is formed of a metal plate, for example. The front antenna 45 is supported by a part that is separated from the circuit board 40 or the shield 50. For example, the front antenna 45 is mounted on an inner surface of the housing 30. Alternatively, the front antenna 45 is mounted on an outer surface of a component (e.g., a case 61 (FIG. 2)) housed in the housing 30. The case 61 is a case of a power source unit or an optical disk drive, for example.

The drawings illustrate an embodiment in which the front antenna 45 is disposed on the front right section of the electronic apparatus 1. The front antenna 45 is disposed along the right section of a front edge 40b of the circuit board 40. The front antenna 45 is not limited to being disposed at this position. The front antenna 45 may be disposed on any one of the upper side, the lower side, the right side, the left side, and the back side of the circuit board 40, for example.

Figure 6:
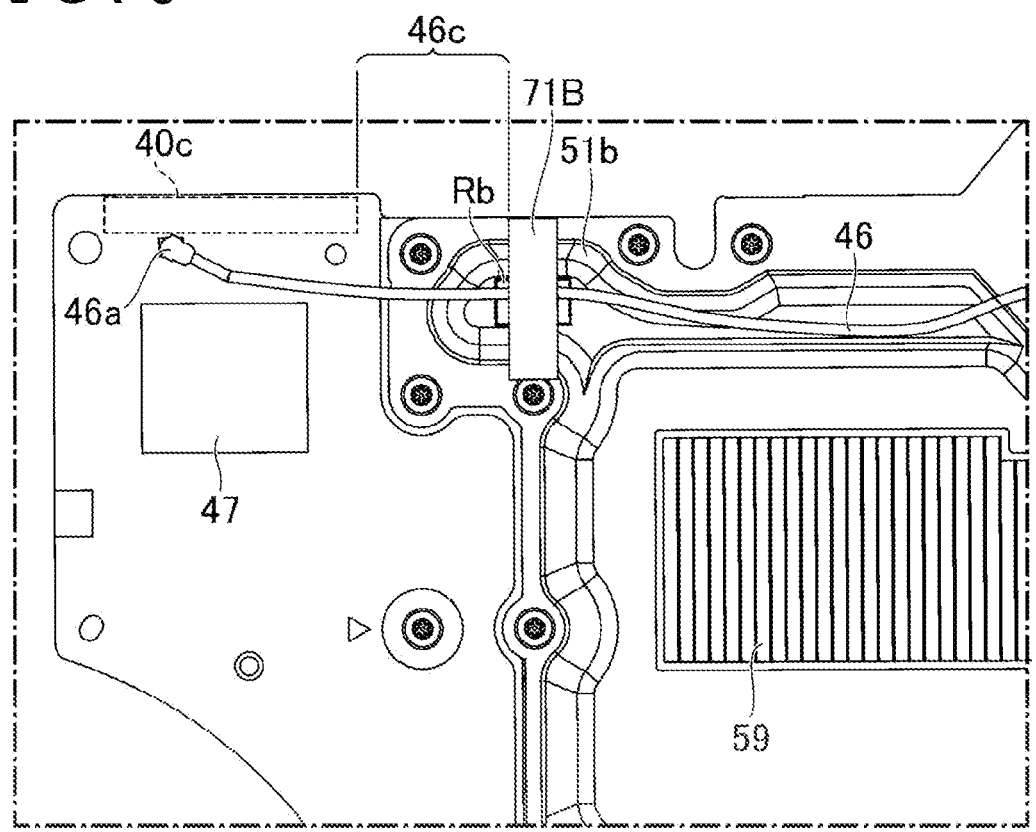
FIG. 6 is an enlarged view of the shield in a region defined by dashed-and-dotted line VI in FIG. 4.

As illustrated in FIG. 6, the electronic apparatus 1 includes a back antenna 40c. The back antenna 40c is a pattern antenna printed on the circuit board 40. Similarly to the front antenna 45, the back antenna 40c is provided for performing wireless communication conforming to the Wi-Fi or Bluetooth (registered trademark) standard. The back antenna 40c is connected to a wireless communication module 47 via a wiring pattern (not illustrated) that is formed on the circuit board 40. The wireless communication module 47 includes a Wi-Fi module for processing Wi-Fi signals and a Bluetooth module for processing Bluetooth signals, for example.

The back antenna 40c is formed in a position apart from the front antenna 45. Specifically, the back antenna 40c is formed on the left section of a back edge of the circuit board 40. The front antenna 45 and the back antenna 40c are located on opposite sides with a diagonal line L1 (see FIG. 4) of the circuit board 40 therebetween. In an embodiment other than the illustrated one, the electronic apparatus 1 may include, as the back antenna 40c, an antenna that is formed of a metal plate.

The electronic apparatus 1 includes a cable 46, as illustrated in FIG. 3. The cable 46 is a coaxial cable. An end of the cable 46 is connected to the front antenna 45. In the illustrated embodiment, the cable 46 is connected to the front antenna 45. A connector 46a is provided on the opposite end of the cable 46. The cable 46 is connected to the circuit board 40 through the connector 46a, and the antenna 45 is connected to the wireless communication module 47 (specifically, a Wi-Fi module and a Bluetooth module) via the cable 46 and a wiring pattern formed on the circuit board 40.

The cable 46 is disposed on the upper surface of the shield 50, as illustrated in FIG. 3. In the right section of the electronic apparatus 1, the cable 46 extends from the front antenna 45 toward the back side. Further, in the back section of the electronic apparatus 1, the cable 46 is bent, and then, extends from the bent portion to the left side. The cable 46 includes the connector 46a on an end (left end) of the cable 46. The connector 46a is located near the wireless communication module 47. As illustrated in the drawings, the connector 46a may be located between the wireless communication module 47 and the antenna 40c.

A plurality of adhesive tapes 72 (attachment members) are pasted on the shield 50, as illustrated in FIG. 3. Each adhesive tape 72 includes a flexible base material which is paper, cloth, a resin film, a metallic foil, or the like and an adhesive applied on one surface of the base material. With the plurality of adhesive tapes 72, the cable 46 is attached to the upper surface of the shield 50. A portion of the cable 46 where each adhesive tape 72 is provided is in contact with the upper surface of the shield 50. The plurality of adhesive tapes 72 are arranged at intervals in the extension direction of the cable 46. With the adhesive tapes 72, the cable 46 is attached to the upper surface of the shield 50. Since the adhesive tapes 72 are used, the cable 46 can be attached to the shield 50 without any processing being applied to the shield 50. Each adhesive tape 72 is a thin member. Unlike cushioning members 71A, 71B, and 71C, which will be explained later, the adhesive tapes 72 are not in contact with the inner surface of the housing 30. In an embodiment other than that illustrated in the drawings, a hook (attachment member) may be formed on the shield 50. Further, while being hung on the hook, the cable 46 may be attached on the shield 50.

The electronic apparatus 1 includes the first cushioning member 71A at a position close to the front antenna 45, as illustrated in FIG. 3. The first cushioning member 71A is disposed between the upper surface of the shield 50 and an inner surface of the housing 30, and is in contact with the upper surface of the shield 50 and the inner surface of the housing 30 (the lower surface of the upper housing member 31A), as illustrated in FIG. 2. The first cushioning member 71A is formed of a material that is deformable in the thickness direction of the circuit board 40. For example, the material of the first cushioning member 71A is rubber, sponge, or the like. The cable 46 passes between the first cushioning member 71A and the shield 50. The inner surface of the housing 30 presses the first cushioning member 71A against the shield 50.

The electronic apparatus 1 includes the second cushioning member 71B at a position close to the back antenna 40c, as illustrated in FIG. 6. Similarly to the first cushioning member 71A, the second cushioning member 71B is in contact with the upper surface of the shield 50 and the inner surface of the housing 30 (the lower surface of the upper housing member 31A). The material of the second cushioning member 71B may also be rubber or sponge. The cable 46 passes between the second cushioning member 71B and the shield 50. The inner surface of the housing 30 presses the second cushioning member 71B against the shield 50.

According to this structure, the state where the cable 46 is in contact with the shield 50 can be stably maintained for a long period of time. For example, even in a case where the adhesiveness of the adhesive tapes 72 is deteriorated due to heat generated by the CPU or the GPU or the irregularity of the shield 50, contact between the cable 46 and the shield 50 is stably maintained at the positions of the cushioning members 71A and 71B. In addition, using the cushioning members 71A and 71B makes it possible to bring the cable 46 into contact with the shield 50 without any processing being applied to the shield 50.

The electronic apparatus 1 may further include the third cushioning member 71C, as illustrated in FIG. 3. The third cushioning member 71C is located between the two cushioning members 71A and 71B in the extension direction of the cable 46. Similarly to the cushioning members 71A and 71B, the third cushioning member 71C is also in contact with the upper surface of the shield 50 and the inner surface of the housing 30 (the lower surface of the upper housing member 31A). The material of the third cushioning member 71C may also be rubber or sponge. The cable 46 passes between the third cushioning member 71C and the shield 50. The inner surface of the housing 30 presses the third cushioning member 71C against the shield 50.

Adhesives are applied to the lower surfaces of the cushioning members 71A, 71B, and 71C. The cushioning members 71A, 71B, and 71C may be stuck to the shield 50 with the adhesives. According to this structure, when the electronic apparatus 1 is assembled, the cushioning members 71A, 71B, and 71C can fix the cable 46 before the upper housing member 31A and the lower housing member 31B are put together.

As previously explained, in addition to the cushioning members 71A, 71B, and 71C, the adhesive tapes 72 are used to attach the cable 46 to the shield 50 in the electronic apparatus 1. As a result of this combination of the cushioning members 71A, 71B, and 71C and the adhesive tapes 72, the contact between the cable 46 and the shield 50 can be more reliably maintained while the cost for fixing the cable 46 is reduced.

The cable 46 is attached to the shield 50 with the plurality of adhesive tapes 72 and the cushioning members 71A, 71B, and 71C. The first cushioning member 71A is disposed in a position close to the front antenna 45. Specifically, the distance between the first cushioning member 71A and the front antenna 45 is shorter than the distance between an adhesive tape 72 (adhesive tape 72-1 in FIG. 3) of the plurality of adhesive tapes 72 that is the closest to the front antenna 45 and the front antenna 45.

If a portion of the cable 46 that is close to the front antenna 45 is separated from the shield 50, the portion separated from the shield 50 may work as an antenna. This produces an adverse effect on the reception performance of the back antenna 40c. For example, the portion separated from the shield 50 receives a radio wave emitted from the front antenna 45, and the received radio wave is transmitted as noise to the connector 46a through the cable 46 (more specifically, an external conductor of the coaxial cable), so that an adverse effect may be produced on the reception performance of the back antenna 40c which is near the connector 46a. In contrast, in the electronic apparatus 1, the first cushioning member 71A reliably brings the portion close to the front antenna 45 into contact with the shield 50, whereby an adverse effect on the reception performance of the back antenna 40c can effectively be suppressed.

It is desirable that the distance from a portion of the cable 46 pressed against the first cushioning member 71A to the front antenna 45 be shorter than ¼ of a wavelength 2 of the radio wave transmitted from the front antenna 45 (a signal outputted from the wireless communication module 47). That is, it is desirable that the length of a portion 46b in FIG. 3 be shorter than λ/4. This can effectively prevent the portion 46b from receiving a radio wave emitted from the front antenna 45.

The second cushioning member 71B is disposed at a position close to the back antenna 40c. Specifically, the distance between the second cushioning member 71B and the back antenna 40c is shorter than the distance between an adhesive tape 72 (adhesive tape 72-3 in FIG. 3) of the plurality of adhesive tapes 72 that is the closest to the back antenna 40c and the back antenna 40c. Thus, with the second cushioning member 71B, the portion of the cable 46 that is close to the back antenna 40c is reliably in contact with the shield 50.

If the portion of the cable 46 that is close to the back antenna 40c is separated from the shield 50, the portion separated from the shield 50 may also work as an antenna. For example, the cable 46 (the portion separated from the shield 50) may receive a radio wave emitted from the back antenna 40c. In this case, the received radio wave can be transmitted as noise to the front antenna 45 through the cable 46 (more specifically, an external conductor of the coaxial cable). In contrast, in the electronic apparatus 1, the second cushioning member 71B reliably brings the portion of the cable 46 that is close to the back antenna 40c into contact with the shield 50. Accordingly, noise propagating through the cable 46 can effectively be reduced. An adverse effect on the reception performance of the front antenna 45 can effectively be suppressed.

Also, it is desirable that the distance from a portion of the cable 46 pressed against the second cushioning member 71B to the back antenna 40c be shorter than ¼ of the wavelength 2 of a radio wave transmitted from the back antenna 40c (a signal transmitted from the wireless communication module 47). That is, it is desirable that the length of a portion 46c in FIG. 6 be shorter than λ/4. This can effectively prevent the portion 46c from receiving a radio wave emitted from the back antenna 40c.

For example, the front antenna 45 and the back antenna 40c may use radio waves of the same frequency band, and may be used in two different communication standards (e.g., the Wi-Fi standard and the Bluetooth standard). In a case where the antennas are used in this manner, if the portion of the cable 46 close to the front antenna 45 and the portion of the cable 46 close to the back antenna 40c are separated from the shield 50, these portions separated from the shield 50 work as a reception antenna and a transmission antenna, respectively. As a result, interference of radio waves under the two communication standards can occur. This can produce an adverse effect on the reception performance of the front antenna 45 and the reception performance of the back antenna 40c. In the electronic apparatus 1, such interference can be suppressed since the two cushioning members 71A and 71B reliably bring the two portions of the cable 46, that is the portion of the cable 46 close to the antenna 45 and the portion of the cable 46 close to the back antenna 40c, into contact with the shield 50. In the electronic apparatus 1, the third cushioning member 71C is disposed between the two cushioning members 71A and 71B. Interference can effectively be suppressed since the cushioning member 71C also reliably brings the cable 46 into contact with the shield 50.

In the embodiment illustrated in the drawings, the distance between the third cushioning member 71C and the back antenna 40c is also shorter than the distance between an adhesive tape 72 (adhesive tape 72-3 in FIG. 3) of the plurality of adhesive tapes 72 that is the closest to the back antenna 40c and the back antenna 40c.

The inner surface of the housing 30 (the lower surface of the upper housing member 31A) includes a projection 31a that is projected toward the cushioning member 71A, as illustrated in FIG. 2. The cable 46 is located below the projection 31a. According to this structure, a contact pressure between the cable 46 and the shield 50 can easily be ensured. The inner surface of the housing 30 includes the projections 31a also in the positions of the cushioning members 71B and 71C. Further, the projection 31a may press the cushioning members 71B and 71C against the shield 50.

The shield 50 includes a projection 51a on the front section thereof, as illustrated in FIG. 2. Unlike the outer peripheral portion 50a (see FIG. 3) of the shield 50, the projection 51a is not in contact with the upper surface of the circuit board 40. The lower surface of the projection 51a covers an electronic component (not illustrated) mounted on the circuit board 40. The cushioning member 71A is disposed between the projection 51a and the inner surface of the housing 30. According to this structure, the thickness of the cushioning member 71A can be reduced.

The shield 50 includes a projection 51b on the back section thereof, as illustrated in FIG. 3. The lower surface of the projection 51b covers an electronic component (not illustrated) mounted on the circuit board 40. The second cushioning member 71B is disposed between the projection 51b and the inner surface of the housing 30. According to this structure, the thickness of the second cushioning member 71B can be reduced. In addition, the shield 50 further includes a projection 51c in the position of the third cushioning member 71C, as illustrated in FIG. 3. The third cushioning member 71C is disposed between the projection 51c and the inner surface of the housing 30.

Besides the projections 51a, 51b, and 51c, a plurality of projections 51m that cover electronic components mounted on the circuit board 40 are formed on the shield 50, as illustrated in FIG. 3. Of the plurality of projections on the shield 50, the projection 51a on which the first cushioning member 71A is disposed is the closest to the front antenna 45. That is, the cable 46 is attached, with the first cushioning member 71A, to the projection 51a through which the cable 46 first passes in the direction (back direction) extending from the front antenna 45. In a position rearward of the projection 51a, the cable 46 is attached to the shield 50 with the adhesive tapes 72 (attachment members) or a hook (attachment member) that is formed on the shield 50.

Of the plurality of projections on the shield 50, the projection 51b on which the second cushioning member 71B is disposed is the closest to the back antenna 40c, as illustrated in FIG. 3. That is, the cable 46 is attached, with the second cushioning member 71B, to the projection 51b through which the cable 46 first passes in the direction (right direction) extending from the connector 46a which is disposed on an end close to the back antenna 40c.

Figure 5:
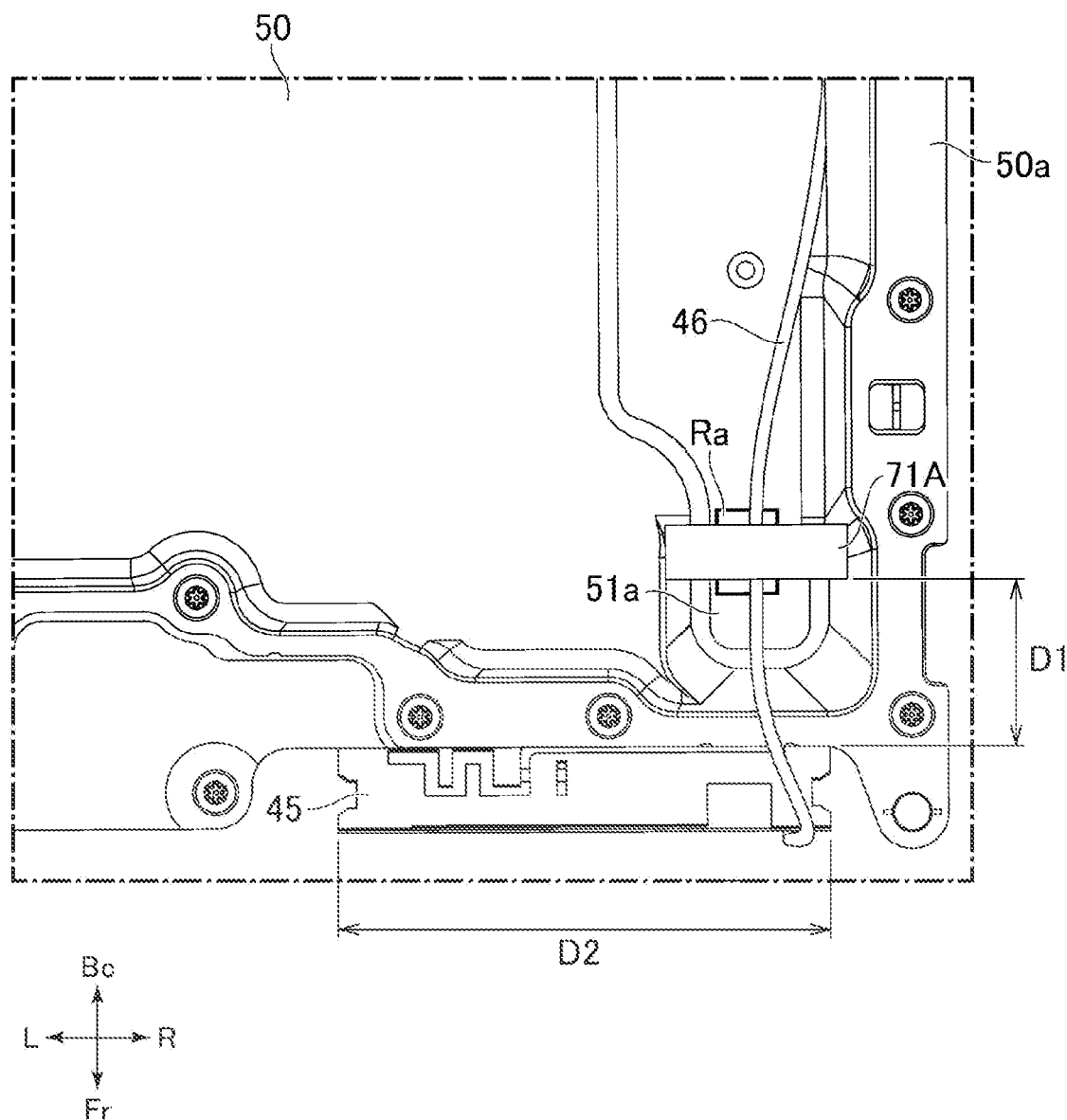
FIG. 5 is an enlarged view of the shield in a region defined by dashed-and-dotted line V in FIG. 4.

In a plan view of the circuit board 40 illustrated in FIG. 5, a distance D1 between the cushioning member 71A and the front antenna 45 is shorter than a size D2 of the front antenna 45. The size D2 represents the width in the left-right direction, for example. In a case where the height (up-down direction width) of the front antenna 45 is larger than the left-right direction width of the front antenna 45, the distance D1 between the cushioning member 71A and the front antenna 45 may be smaller than the height of the front antenna 45.

The shield 50 may have marks at positions in which the cushioning members 71A and 71B are disposed and through which the cable 46 passes. For example, lines indicating regions Ra and Rb through which the cable 46 passes may be drawn on the upper surface of the shield 50, as illustrated in FIGS. 5 and 6.

As explained so far, the electronic apparatus 1 includes the shield 50 that is in contact with the ground pattern 40a on the circuit board 40 and that functions as a ground part. The cable 46 extends from the front antenna 45, is connected to the circuit board 40, and passes between the shield 50 and the first cushioning member 71A. In addition, the cable 46 passes between the shield 50 and the second cushioning member 71B. The inner surface of the housing 30 (the lower surface of the upper housing member 31A) presses the cushioning members 71A and 71B against the shield 50. According to this structure, the state where the cable 46 is in contact with the shield 50 can be stably maintained for a long period of time. It is to be noted that the cushioning members 71A, 71B, and 71C and the adhesive tapes 72 may press two or more cables against the shield 50.

In addition, the distance between the first cushioning member 71A and the front antenna 45 is shorter than the distance between an adhesive tape 72 (adhesive tape 72-1 in FIG. 3) of the plurality of adhesive tapes 72 that is the closest to the front antenna 45 and the front antenna 45. Accordingly, it is possible to effectively avoid a situation where noise is transmitted through the cable 46 and the noise produces an adverse effect on the reception performance of the back antenna 40c.

In addition, the distance between the second cushioning member 71B and the back antenna 40c is shorter than the distance between an adhesive tape 72 (adhesive tape 72-3 in FIG. 3) of the plurality of adhesive tapes 72 that is the closest to the back antenna 40c and the back antenna 40c. Accordingly, it is possible to effectively avoid a situation where noise is transmitted through the cable 46 and the noise produces an adverse effect on the reception performance of the front antenna 45.

In the electronic apparatus 1 illustrated in the drawings, the inner surface of the housing 30 presses the cushioning members 71A, 71B, and 71C against the upper surface of the shield 50. In another embodiment, a member that is housed in the housing 30 and that is disposed on the upper side of the shield 50 may press the cushioning members 71A, 71B, and 71C. For example, an optical disk drive or a cooling fan may be housed in the housing 30. The optical disk drive or the cooling fan may press any one, two, or all of the cushioning members 71A, 71B, and 71C against the upper surface of the shield 50.

In addition, in the electronic apparatus 1 illustrated in the drawings, the cushioning members 71A, 71B, and 71C are pressed against the upper surface of the shield 50, and the cable 46 is in contact with the shield 50. In another embodiment, any one, two, or all of the cushioning members 71A, 71B, and 71C may be pressed against the ground pattern 40a on the circuit board 40, and the cable 46 may be in contact with the ground pattern 40a. In still another embodiment, the electronic apparatus 1 may include a conductor member that is in contact with the ground pattern 40a on the circuit board 40 but is separate from the shield 50. In this case, any one, two, or all of the cushioning members 71A, 71B, and 71C may be pressed against the conductor member, and the cable 46 may be in contact with the conductor member.

REFERENCE SIGNS LIST

1: Electronic apparatus
30: Housing
31A: Upper housing member
31B: Lower housing member
31a: Projection
31b: Air vent
39: Front panel
40: Circuit board
40a: Ground pattern
40b: Front edge
40c: Back antenna
41: Electronic component
45: Front antenna
46: Cable
50: Shield
50a: Outer peripheral portion
51a, 51b, 51c, 51m: Projection
61: Case
71A, 71B, 71C: Cushioning member
72: Adhesive tape

The invention claimed is:

1. An electronic apparatus comprising:
a circuit board;
a ground part that is formed on the circuit board or is mounted on the circuit board;
a first antenna;
at least one cushioning member;
a cable that extends from the first antenna, that is connected to the circuit board, and that passes between the ground part and the at least one cushioning member; and
a member that presses the cushioning member against the ground part.

2. The electronic apparatus according to claim 1, further comprising:

a housing in which the circuit board, the ground part, the at least one cushioning member, and the cable are disposed,
wherein the member that presses the cushioning member against the ground part is the housing.

3. The electronic apparatus according to claim 1, comprising: as the ground part, a shield that covers an electronic component mounted on the circuit board.

4. The electronic apparatus according to claim 1, comprising: a plurality of attachment members with which the cable is attached to the ground part, at positions separated from the at least one cushioning member.

5. The electronic apparatus according to claim 4, further comprising:
a second antenna,
wherein a distance between the at least one cushioning member and the first antenna is shorter than a distance between an attachment member of the plurality of attachment members that is the closest to the first antenna and the first antenna.

6. The electronic apparatus according to claim 4, further comprising:
a second antenna,
wherein a distance between the at least one cushioning member and the second antenna is shorter than a distance between an attachment member of the plurality of attachment members that is closest to the second antenna and the second antenna.

7. The electronic apparatus according to claim 1, wherein the cable includes a portion that is pressed against the ground part by the at least one cushioning member, and
a distance from the portion of the cable to the first antenna is shorter than $1/4$ of a wavelength of a radio wave transmitted from the first antenna.

8. The electronic apparatus according to claim 1, further comprising:
a second antenna, wherein
the cable includes a portion that is pressed against the ground part by the at least one cushioning member, and
a distance from the portion of the cable to the second antenna is shorter than $1/4$ of a wavelength of a radio wave transmitted from the second antenna.

* * * * *